(12) United States Patent
Hendrix et al.

(10) Patent No.: US 7,280,366 B1
(45) Date of Patent: Oct. 9, 2007

(54) SYSTEM AND METHOD FOR HOUSING POWER SUPPLIES IN AN ELECTRONIC DEVICE

(75) Inventors: A. Fred Hendrix, Salida, CA (US); Francisco Martinez-Ponce, Modesto, CA (US)

(73) Assignee: Foundry Networks, Inc., Santa Clara, CA (US)

( * ) Notice: Subject to any disclaimer, the term of this patent is extended or adjusted under 35 U.S.C. 154(b) by 312 days.

(21) Appl. No.: 10/810,498

(22) Filed: Mar. 26, 2004

(51) Int. Cl.
*H05K 1/00* (2006.01)

(52) U.S. Cl. .................................. 361/724; 312/223.2

(58) Field of Classification Search ........ 361/724–727; 312/223.1, 223.2, 223.6
See application file for complete search history.

(56) References Cited

U.S. PATENT DOCUMENTS

| | | | | |
|---|---|---|---|---|
| 4,744,005 A | * | 5/1988 | Milani | 361/687 |
| 4,967,155 A | * | 10/1990 | Magnuson | 324/212 |
| 5,195,022 A | * | 3/1993 | Hoppal et al. | 361/685 |
| 5,216,579 A | * | 6/1993 | Basara et al. | 361/683 |
| 5,450,285 A | * | 9/1995 | Schlemmer | 361/724 |
| 5,515,239 A | * | 5/1996 | Kamerman et al. | 361/727 |
| 5,602,721 A | * | 2/1997 | Slade et al. | 361/727 |
| 5,973,918 A | * | 10/1999 | Felcman et al. | 361/683 |
| 6,018,456 A | * | 1/2000 | Young et al. | 361/684 |
| 6,392,901 B1 | * | 5/2002 | Colver et al. | 361/826 |
| 6,583,989 B1 | * | 6/2003 | Guyer et al. | 361/724 |
| 6,594,150 B2 | * | 7/2003 | Creason et al. | 361/727 |
| 6,742,068 B2 | * | 5/2004 | Gallagher et al. | 710/302 |
| 6,754,068 B2 | | 6/2004 | Yonenaka et al. | |
| 6,839,237 B2 | * | 1/2005 | Berry et al. | 361/727 |
| 2001/0026436 A1 | * | 10/2001 | Tanzer et al. | 361/610 |
| 2002/0181202 A1 | * | 12/2002 | Jeudi | 361/690 |
| 2003/0223193 A1 | * | 12/2003 | Smith et al. | 361/687 |

* cited by examiner

*Primary Examiner*—Lisa Lea-Edmonds
(74) *Attorney, Agent, or Firm*—Thelen Reid Brown Raysman & Steiner LLP; David B. Ritchie

(57) ABSTRACT

A housing for an electronic device has a first volume bounded by a first face and a second volume bounded by a second face. The second face is indented from the first face. A plurality of electronic components are housed in the first volume, and one or more power supplies are housed in the second volume. The electronic components are operable to be powered by a coupling to the one or more power supplies, the coupling running between the indented second face and the first face.

41 Claims, 10 Drawing Sheets

SYSTEM AND METHOD FOR HOUSING POWER SUPPLIES IN AN ELECTRONIC DEVICE

FIELD OF THE INVENTION

The invention is directed towards housing power supplies for an electronic device. More specifically, the invention is directed towards a chassis design for modular or attached power supply units.

BACKGROUND OF THE ART

Many electronic components, such as computer systems, need a power supply for operation. In some multi-unit systems, the power supplies need to supply a large amount of power while minimizing the volume used to house the power system.

Some typical "box" component systems have built-in power supply slots in the system itself. However, the "built-in" systems tend to conform to the measurements of the main chassis itself. In this manner, external connections between the power supplies and the components tend to bow out in an arc-like manner from the rear plane of the panel enclosing the power supplies to the connections for the components. In use, such "cord-draping" of high-current power supply cables can pose potential problems with access to other connectors at the rear of the "boxes" and the like.

When the full cord is exposed, the cords tend to become a jumble of connections that are hard to decipher. In this case, care must be taken to distinguish the cords running between the power supply and the input power connection, and the "draping" effect leads to the maximum amount of visible cord possible. This draping often leads to confusing masses of cord and/or tangles in the cords when a plurality of components and/or power supplies are involved.

Further, the cords may also pose a reliability issue. When placed near passageways, or when under service for whatever reason, the "draping" effect leads to large amounts of cord that may be inadvertently yanked or tugged. In this manner, if the cords are pulled from the connections to the electronic components, the cords may be separated from the component, the power supply, or both. When this happens the component may cease to operate, leading to downtime and possible failures to other related components.

BRIEF DESCRIPTION OF INVENTION

A housing for an electronic device has a first volume bounded by a first face and a second volume bounded by a second face. The second face is indented from the first face. A plurality of electronic components are housed in the first volume, and one or more power supplies are housed in the second volume. The electronic components are operable to be powered by a coupling to the one or more power supplies, the coupling running between the indented second face and the first face.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of a system and method for housing power supplies for an electronic device are described herein in the context of an enclosure for the storage and operation of electronic components. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another. Moreover, it will be appreciated that such a development effort might be complex and time-consuming, but would nevertheless be a routine undertaking of engineering for those of ordinary skill in the art having the benefit of this disclosure. In accordance with the present invention, the components or structures may be implemented using various types of items.

Figure 1:
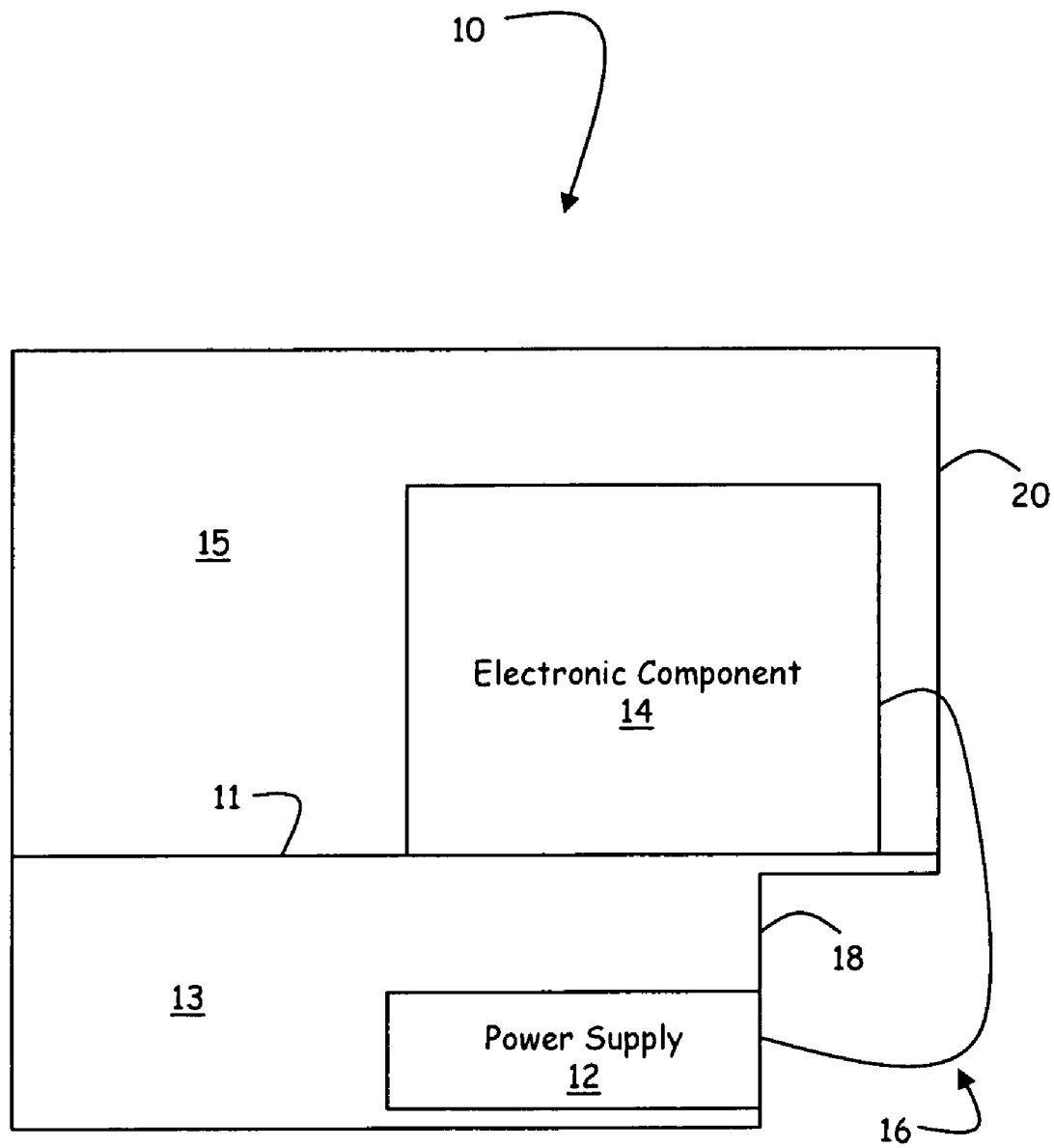
FIG. 1 is a cutaway side view of a housing for electronic components with an attached power supply chassis in accordance with an embodiment of the present invention.

FIG. 1 is a cutaway side view of a housing for electronic components with an attached power supply chassis in accordance with an embodiment of the present invention. A chassis 10 encloses both electronic components 14 and the associated power supply or supplies 12. The chassis 10 can be divided into subsections by an inner wall 11. The electronic components 14 are housed in a housing, the electronic component chassis 15, and the power supply 12 is housed within a sub-chassis 13.

When the inner wall 11 is present, the electronic component chassis 15 can be isolated from the sub-chassis 13. In this manner the electronic component(s) 14 can be protected from any environmental conditions associated with the power supply 12.

In an aspect of the invention, at least portions of the face of the sub-chassis 13 are indented from the plane of the corresponding face of the electronic component chassis 15. As shown, the sub-chassis 13 is indented from the faces of the electronic component chassis 15.

A power supply cord 16 runs from the power supply 12 to the electronic component 14. The differing plane of the electronic component chassis 15 and the sub-chassis 13 provide an overhang or ledge that shields the connector from being disturbed by external influences, such as pedestrians or other components. In the depicted embodiment, the "looping" of the connector between the electronic component 14 and the power supply 12 is protected in the vertical plane by the overhang 17 of the electronic component chassis. Thus, the risk of accidental disconnection is minimized, and the profile of the power supply cord 16 that extends beyond the profile of the chassis 10 is minimized relative to the overall profile of the system.

In an embodiment, a face 20 of the electronic component chassis 15 follows a contour at approximately a first distance from its opposite face. To create the overhang, the face of the sub-chassis 13 is in an approximately parallel relationship to the plane of the face 20, but disposed inward in the direction towards the opposite face of electronic component chassis 15. Accordingly, the "loop" of the power supply cord 16 coupling the power supply 12 and the electronic component 14 is protected by the overhang created by the electronic component chassis 15 and the sub-chassis 13. Thus, the cord 16 impinges across the plane of the face 20 in a less intrusive manner than if the face 20 and a back face 18 of the sub-chassis 13 were at approximately the same distance from the front edge of the chassis assembly.

Figure 2:
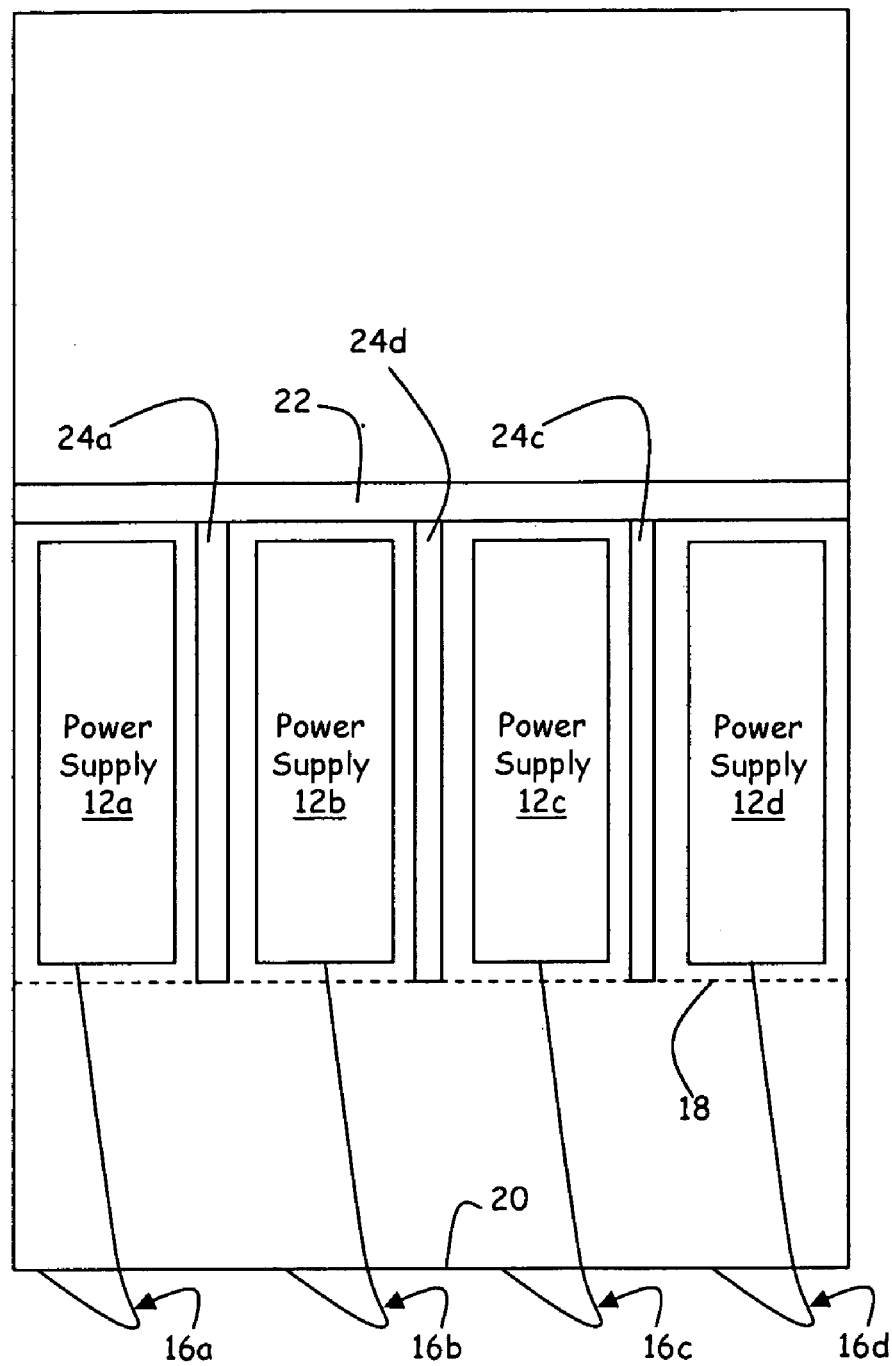
FIG. 2 is a cutaway top plan view of a housing for electronic components with an attached power supply chassis in accordance with an embodiment of the present invention.

FIG. 2 is a cutaway top plan view of a housing for electronic components with an attached power supply chassis in accordance with an embodiment of the present invention. In this embodiment, the chassis 10 has a plurality of power supplies 12a-d. A plurality of power supply cords 16a-d couple the respective power supplies 12a-d to the specific components within the chassis 10. The face 20 indicates the edge of the chassis housing the electronic components. The back face 18 of the sub-chassis 13 is indicated as well in the drawing. The diagram indicates that the cords tend to be placed in the described design under the ledge or within the indentation provided by the interaction of the faces of the chassis. In this manner, the couplings will more likely not be disturbed, since the silhouette of the chassis tends to protect the length of the couplings from external interference.

In one embodiment, the power supplies are placed within portions of the sub-chassis 13. Each of the power supplies 12a-d can be isolated from the other supplies by a structure, such as the walls 24a-c, noted in FIG. 2. This helps protect the individual power supplies.

It should be noted that the majority of the length of the power couplings 16a-d are contained in the volume under the overhang defined by the face 20 of the electronic component chassis 15. Thus, there is a lesser chance of the power cords 16a-d snagging on any foreign object that might come into proximity to the chassis, since power cords 16a-d tend to be protected under the overhang structure and within the indentation defined by the face of the sub-chassis 13 with respect to the electronic component chassis 15.

Further, the indentation/overhang aspect of the chassis ensures that the power couplings must extend in a horizontal manner at least the distance between the indented face 18 of the sub-chassis 13 and the overhanging back face 20 the electronic component chassis 15. Thus, the power cords 16a-d have less "play" in them, since it is used in horizontal extension. As such, the power cords 16a-d tend to run straighter between the power supplies 12a-d and the associated connection points into the electronic component chassis 15. This tends to result in neater defined coupling lines, less "tangling" of cords, and less length of cord to dangle outside the silhouette of the chassis 10 as with other types of conventional chassis designs.

Figure 3:
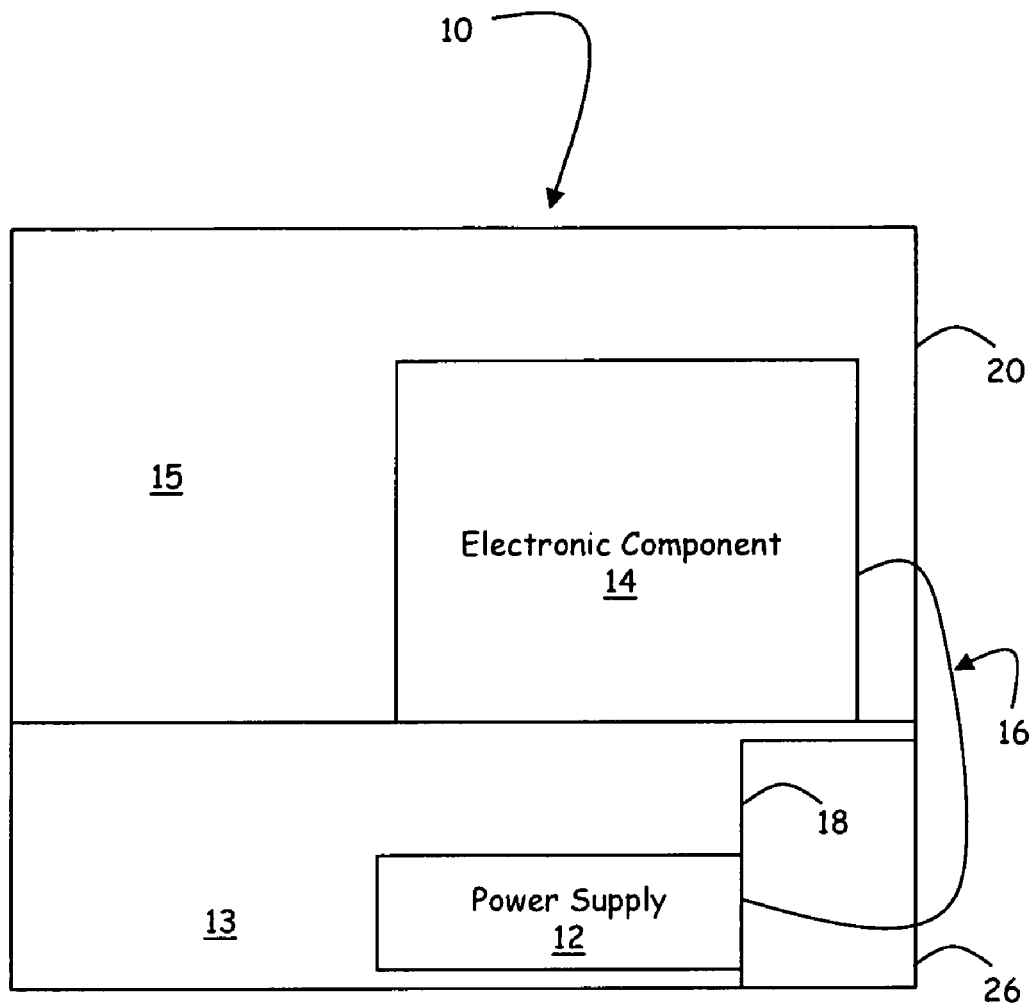
FIG. 3 is a cutaway side view of an alternative housing for electronic components with an attached power supply chassis in accordance with an embodiment of the present invention.

FIG. 3 is a cutaway side view of an alternative housing for electronic components with an attached power supply chassis in accordance with an embodiment of the present invention. Many of the features as shown in FIG. 1 are present in this embodiment, including the overhang/indented orientation of the sub-chassis 13 housing the power supply 12. In this embodiment, however, a cover 26 is placed over the indentation/overhang created by the electronic component chassis 15 and the sub-chassis 13. In effect, the cover "squares off" the form of the overall chassis. This allows the power cord 16 to be even more protected from external interference. In this case, the power coupling is almost completely protected from external interference when it runs from the sub-chassis 13 to the electronic component chassis 15.

Figure 4:
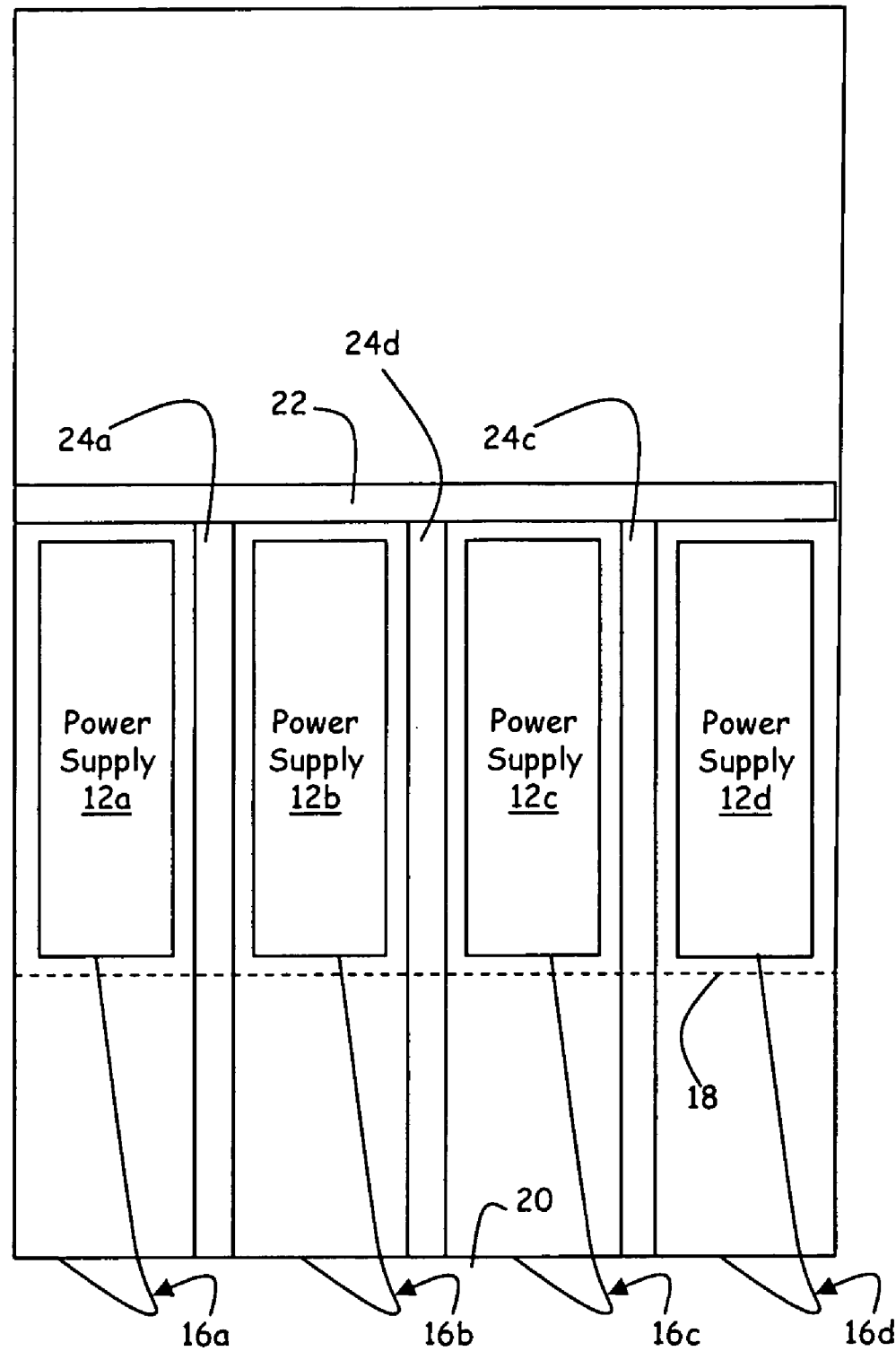
FIG. 4 is cutaway top plan view of the housing for electronic components with an attached power supply chassis of FIG. 3 in accordance with an embodiment of the present invention.

FIG. 4 is cutaway top view of the housing for electronic components with an attached power supply chassis of FIG. 3, in accordance with an embodiment of the present invention. FIG. 4 shows that the cover 26 of FIG. 3 can be made with the same protective structures as mentioned in FIG. 2. The structures within the cover 26 tend to isolate the power supplies 16a-d from each other. Thus, the same protection afforded the power supplies from mishaps happening with the other power supplies is continued into the cover 26 with the continuation of the protective structures into the cover 26.

Should one of the power supplies 16a-d suffer adverse circumstances, the protective structures in the cover 26 shield the other power supplies such circumstances. Thus, in addition to protecting the couplings 16a-d, the cover also serves to protect the power supplies 16a-d.

Figure 5:
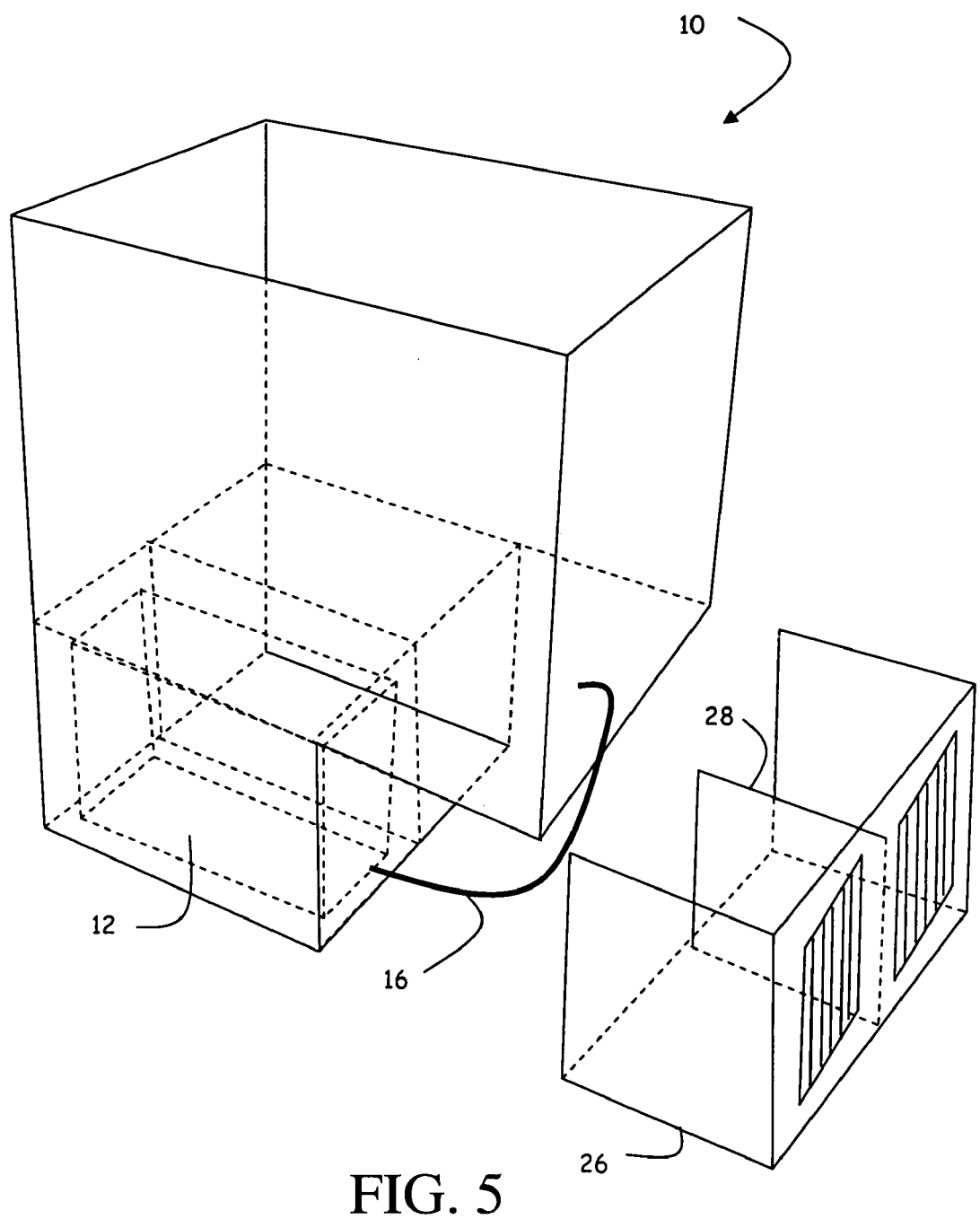
FIG. 5 is a front perspective view of the housing, and the optional cover, according to an embodiment of the present invention.

FIG. 5 is a perspective view of the housing, and the optional cover, according to an embodiment of the present invention. The perspective view shows the indented sub-chassis 13 housing the power supply 12, and the power cord 16 connecting the power supply to an electronic component. This view gives an idea that the indentation/overhang provides protection to the power coupling 16 from interference via external sources. Further, when the cover 26 is placed into the indentation volume, the structures within the cover 26 give further protection to the unit.

The cover 26 can be coupled by a variety of mechanisms to the chassis 10. Those of ordinary skill in the art will now know that these many coupling mechanisms exist, and this application should be read as including them. Further, those of ordinary skill in the art will now realize that the cover 26 may be coupled to the sub-chassis 13. Or the cover 26 may be coupled electronic component chassis 15. Again, this application should be read as including these types of coupling devices, including slots, hooks, rails, wings with fasteners, to name just a few.

Figure 6:
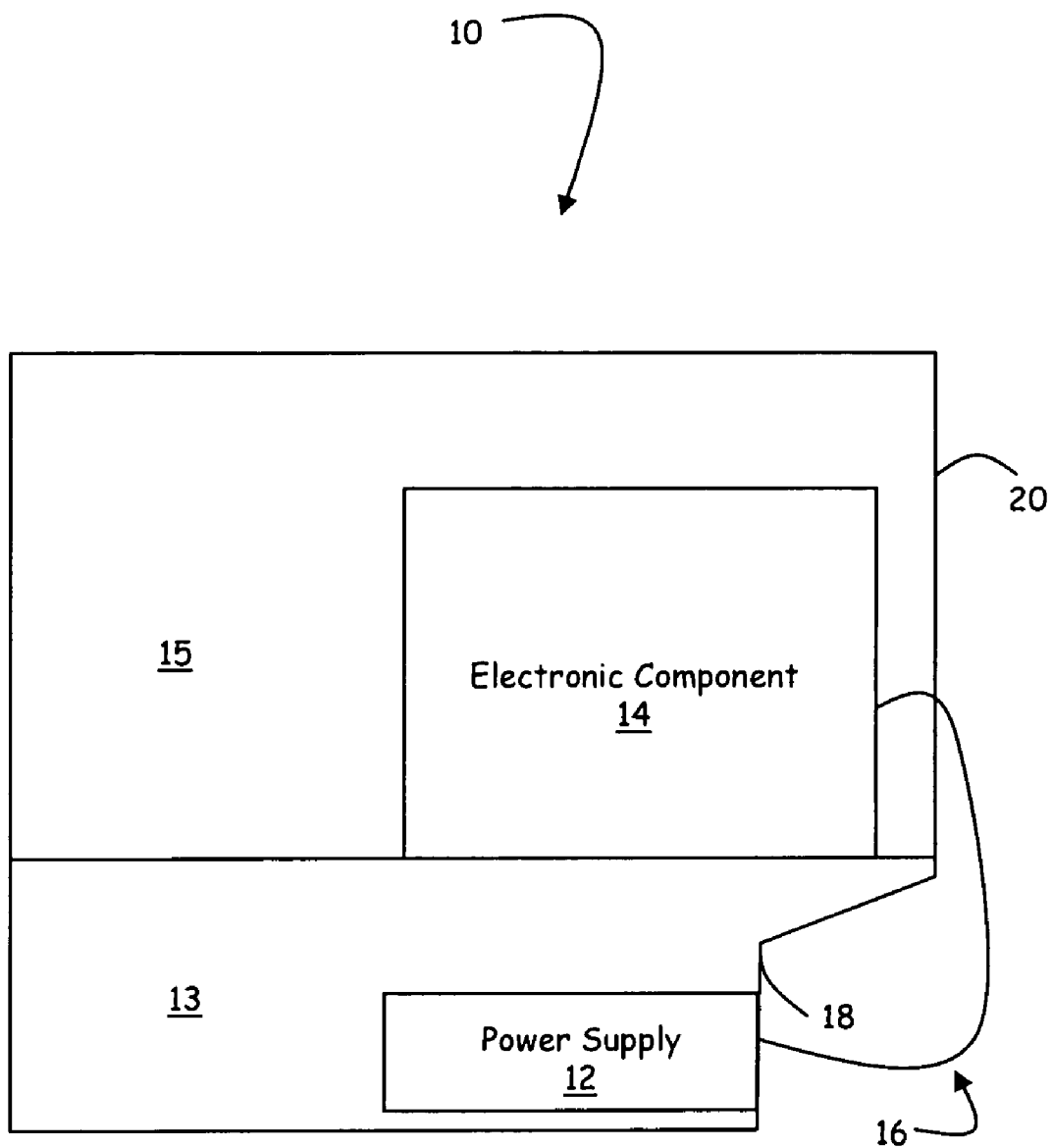
FIG. 6 is a cutaway side view of a housing for electronic components with an attached power supply chassis in accordance with an embodiment of the present invention.

FIG. 6 is a cutaway side view of a housing for electronic components with an attached power supply chassis in accordance with an embodiment of the present invention. On this chassis, the orientation of the connecting face between the back face 20 of the electronic component chassis 15 and the sub-chassis 13 is different than that depicted in the other drawings. Those of ordinary skill in the art will now realize that the connecting face can be oriented in a number of differing ways, and this description should be read to include those orientations.

Figure 7:
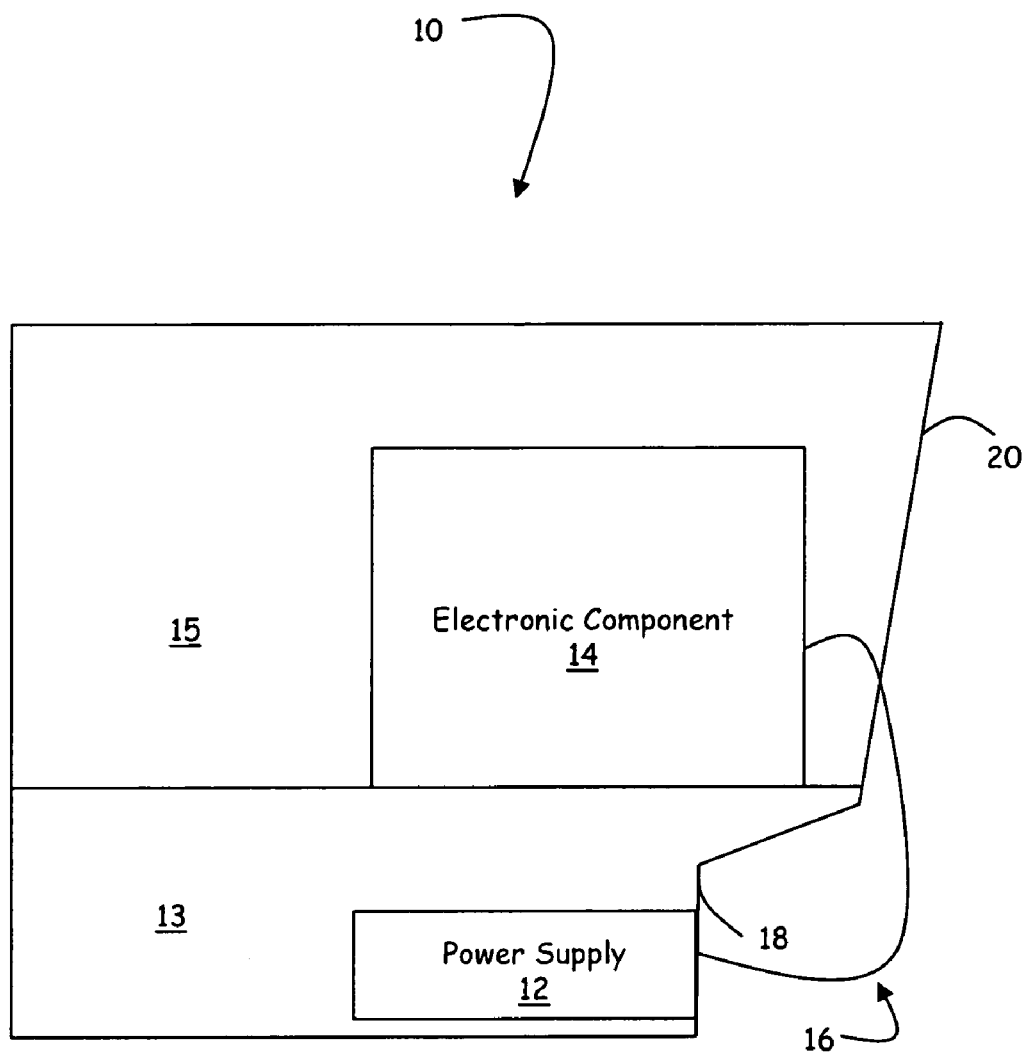
FIG. 7 is a cutaway side view of a housing for electronic components with an attached power supply chassis in accordance with an embodiment of the present invention.

FIG. 7 is a cutaway side view of a housing for electronic components with an attached power supply chassis in accordance with an embodiment of the present invention. On this chassis, the orientation of the back face 20 of the electronic component chassis 15 and corresponding face 18 of the sub-chassis 13 is different than that depicted in the other drawings. In this case, it should be noted that the face 20 and the face 18 are not in a parallel relationship. However, the overhang/indentation relationship between the faces is present. Those of ordinary skill in the art will now realize that the faces of the various chasses can be oriented in a number of differing ways relative to one another, and this description should be read to include those orientations.

Figure 8:
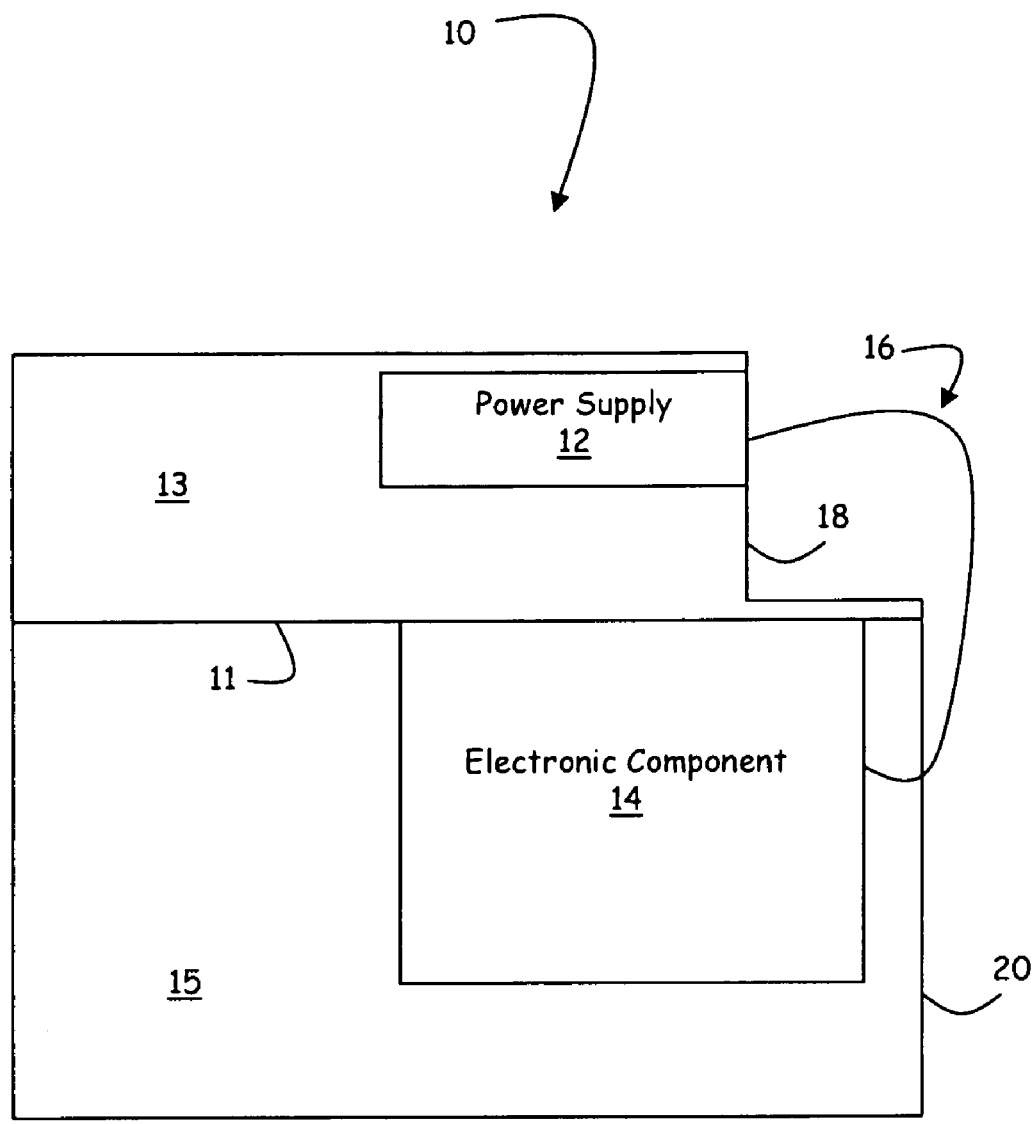
FIG. 8 is a cutaway side view of a housing for electronic components with an attachable power supply chassis in accordance with an embodiment of the present invention.

FIG. 8 is a cutaway side view of a housing for electronic components with an attached power supply chassis in accordance with an embodiment of the present invention. In this chassis, the vertical relationship between the electronic component chassis 15 and the sub-chassis 13 is reversed. Those of ordinary sill in the art will now realize that the vertical relationship between the chasses may be reversed, or that any number of sub-chasses and electronic chasses may be used in the context of the invention.

Figure 9:
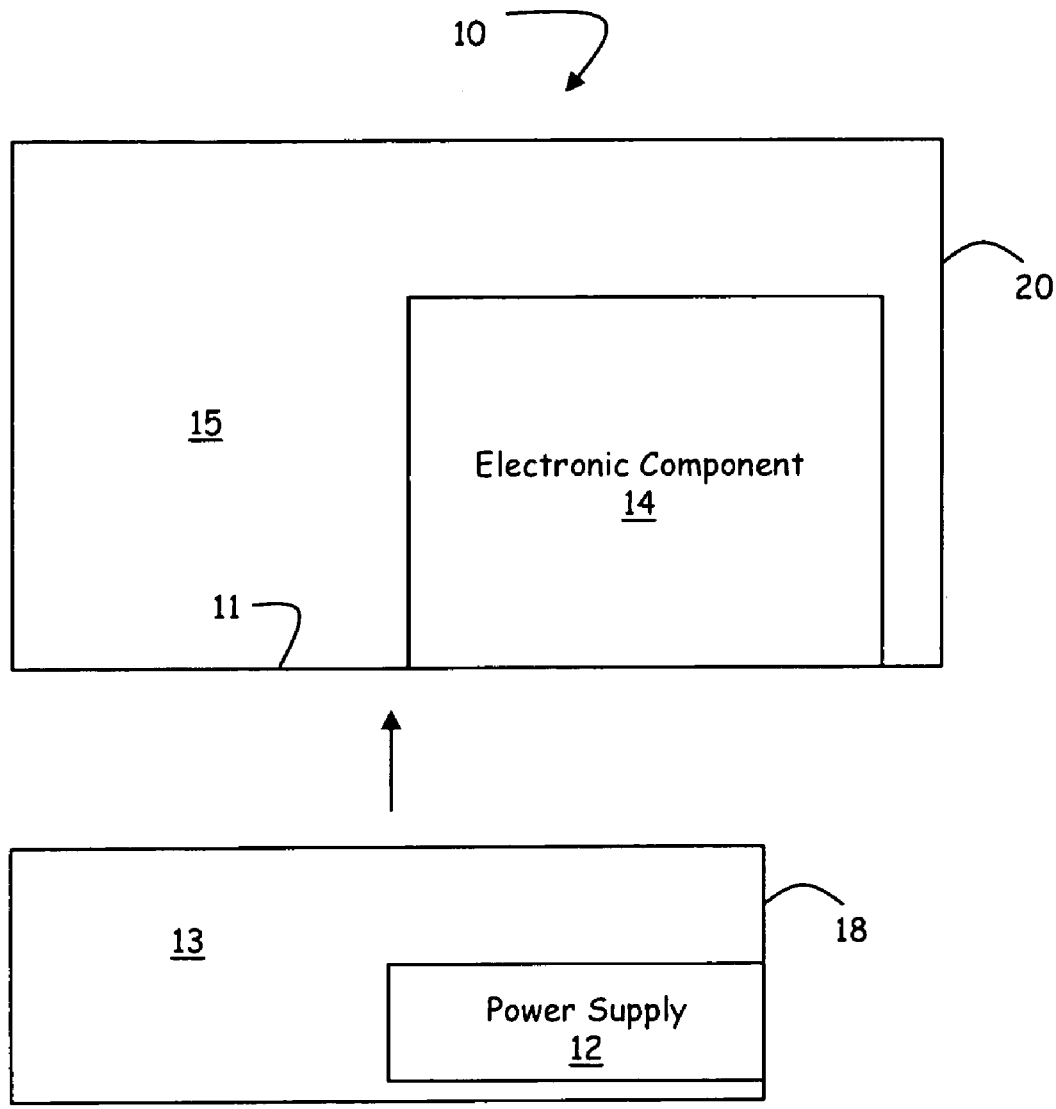
FIG. 9 is a cutaway side view of a housing for electronic components with an attachable power supply chassis in accordance with an embodiment of the present invention.

FIG. 9 is a cutaway side view of a housing for electronic components with an attachable power supply chassis in accordance with an embodiment of the present invention. In this chassis, the sub-chassis 13 is modular, and operable to be attached to the electronic component chassis 15.

Figure 10:
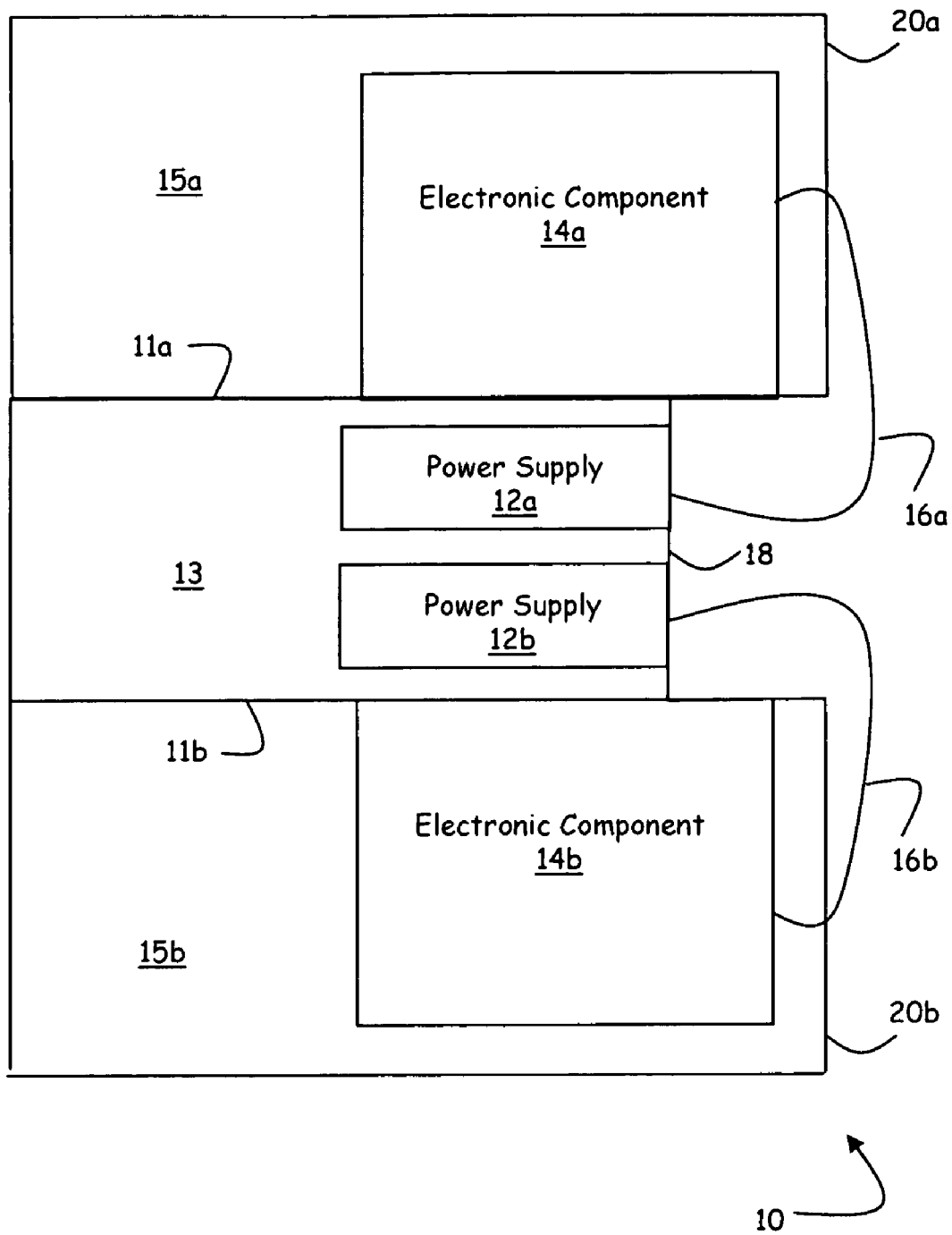
FIG. 10 is a cutaway side view of a housing for electronic components with multiple chasses in accordance with an embodiment of the present invention.

FIG. 10 is a cutaway side view of a housing for electronic components with multiple chasses in accordance with an embodiment of the present invention. In this aspect of the invention, the chassis 10 has multiple electronic component chasses in conjunction with a single sub-chassis. Those of ordinary skill in the art will now realize that any number of electronic component chasses may be utilized, as well as any number of sub-chasses, in the context of the invention.

Accordingly, a system and method for housing power supplies associated with an electronic device is described and illustrated. Those of ordinary skill in the art will now recognize that many modifications and variations of the present invention are possible without departing from the invention. Of course, the various features depicted in each of the figures and the accompanying text may be combined together. Accordingly, it should be clearly understood that the present invention is not intended to be limited by the particular features specifically described and illustrated in the drawings, but the concept of the present invention is to be measured by the scope of the appended claims. It should be understood that various changes, substitutions, and alterations could be made hereto without departing from the spirit and scope of the invention as described by the appended claims that follow.

What is claimed is:

1. An electronic device comprising:
    a first housing comprising a first face;
    a second housing comprising a second face;
    the second face indented from the first face;
    a plurality of electronic components housed in the first housing;
    one or more power supplies housed in the second housing; and
    the electronic components operable to be powered by a cord to the one or more of the plurality of power supplies, the cord running from the indented second face to the first face.

2. The device of claim 1 wherein the second face is higher than the first face.

3. The device of claim 1 wherein the second face is lower than the first face.

4. The device of claim 1 the one or more power supplies is a plurality of power supplies.

5. The device of claim 4 wherein at least two of the power supplies are disposed in separate sub-housings of the second housing, separated by a structure disposed within the second housing.

6. The device of claim 5 further comprising a cover, the cover operable to project an outline upon the indentation that corresponds to the dimension of the first face.

7. The device of claim 6 wherein the cover comprises structures that correspond to the structures disposed within the second housing.

8. The device of claim 1 further comprising a cover, the cover operable to project an outline upon the indentation that corresponds to the dimension of the first face.

9. The device of claim 1 wherein the second housing is operable to be coupled to the first housing.

10. The device of claim 1 wherein the first face is parallel to the second face.

11. The device of claim 1 wherein the first face is not parallel to the second face.

12. An enclosure for an electronic system comprising:
    a first chassis, operable to enclose a plurality of electronic components, comprising:
    a first face;
    a second face opposite the first face;
    a third face, wherein the plane of the third face is perpendicular to the planes of the first face and the second face;
    a second chassis operable to enclose one or more power supplies, the second chassis having a fourth face indented from the first face; and
    one or more cords running from the first fact to the fourth face, the one or more cords operable to supply power from the one or more power supplies to at least one of the plurality of electronic components.

13. The enclosure of claim 12 wherein the second chassis is higher than the first chassis.

14. The enclosure of claim 12 wherein the second chassis is lower than the first chassis.

15. The enclosure of claim 12 the second chassis is operable to enclose a plurality of power supplies.

16. The enclosure of claim 15 wherein at least two of power supplies are operable to be disposed in separate sub-housing of the second chassis, separated by a structure disposed within the second chassis.

17. The enclosure of claim 16 further comprising a cover, the cover operable to project an outline upon the second chassis that corresponds to the dimension of the first face.

18. The enclosure of claim 17 wherein the cover comprises structures that corresponds to the structures disposed within the second chassis.

19. The enclosure of claim 12 further comprising a cover, the cover operable to project an outline upon the indentation that corresponds to the dimension of the first face.

20. The enclosure of claim 12 wherein the second chassis is operable to be selectively coupled to and uncoupled from the first chassis.

21. The enclosure of claim 12 wherein the first face is parallel to the second face.

22. The enclosure of claim 12 wherein the first face is not parallel to the second face.

23. The enclosure of claim 12 further comprising a plurality of first chasses.

24. The enclosure of claim 12 further comprising a plurality of second chasses.

25. An enclosure for an electronic system comprising:
a first chassis operable to enclose a plurality of electronic components, the first chassis comprising a first face and a second face opposite the first face;
a second chassis operable to enclose one or more power supplies, comprising a third face;
one or more cords running from the first fact to the third face, the one or more cords operable to supply power from the one or more power supplies to at least one of the plurality of electronic components; and
wherein the third face and the first face define an indentation, and the second chassis is indented from the first chassis.

26. The enclosure of claim 25 wherein the second chassis is higher than the first chassis.

27. The enclosure of claim 25 wherein the second chassis is lower than the first chassis.

28. The enclosure of claim 25 the second chassis is operable to enclose a plurality of power supplies.

29. The enclosure of claim 28 wherein at least two of power supplies are operable to be disposed in separate sub-housing of the second chassis, separated by a structure disposed within the second chassis.

30. The enclosure of claim 29 further comprising a cover, the cover operable to project an outline upon the second chassis that corresponds to the dimension of the first face.

31. The enclosure of claim 30 wherein the cover comprises structures that corresponds to the structures disposed within the second chassis.

32. The enclosure of claim 25 further comprising a cover, the cover operable to project an outline upon the indentation that corresponds to the dimension of the first face.

33. The enclosure of claim 25 wherein the second chassis is operable to be selectively coupled to and uncoupled from the first chassis.

34. The enclosure of claim 25 wherein the first face is parallel to the third face.

35. The enclosure of claim 25 wherein the first face is not parallel to the third face.

36. The enclosure of claim 25 further comprising a plurality of first chasses.

37. The enclosure of claim 25 further comprising a plurality of second chasses.

38. An enclosure for an electronic system comprising:
means for enclosing a plurality of electronic components, defined by a first face and a second face opposite the first face;
means for making electrical connections disposed through the first face;
means for enclosing one or more power supplies, defined at least in part by a third face; and
wherein the third face and the first face define an indentation.

39. The electronic device of claim 1 wherein
the first face comprises a back face of the first housing; and
the second face comprises a back face of the second housing.

40. The enclosure of claim 12 wherein
the first face comprises a back face of the first chassis; and
the fourth face comprises a back face of the second chassis.

41. The enclosure of claim 25 wherein
the first face comprises a back face of the first chassis; and
the third face comprises a back face of the second chassis.

* * * * *